(12) United States Patent
Bradley et al.

(10) Patent No.: US 6,609,227 B2
(45) Date of Patent: Aug. 19, 2003

(54) SCHEDULER FOR SCHEMATIC RELATED JOBS

(75) Inventors: Douglas Hooker Bradley, Austin, TX (US); Tai Anh Cao, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 09/737,332

(22) Filed: Dec. 15, 2000

(65) Prior Publication Data

US 2002/0078421 A1 Jun. 20, 2002

(51) Int. Cl.[7] .............................................. G06F 17/50
(52) U.S. Cl. ................. 716/1; 716/5; 716/18; 703/14; 703/15; 707/8
(58) Field of Search ....................... 716/1–21; 257/401; 345/519; 703/14, 15, 16, 17; 707/8; 714/726

(56) References Cited

U.S. PATENT DOCUMENTS 5,526,517 A * 6/1996 Jones et al. ..................... 707/8
5,862,149 A * 1/1999 Carpenter et al. .......... 714/726
6,324,678 B1 * 11/2001 Dangelo et al. .............. 716/11

OTHER PUBLICATIONS

Bushnell et al., Mar. 1989, Computer–Aided Design of Integrated Circuit and Systems, IEEE Transactio, 8 Issue, pp. 279–287.*

* cited by examiner

Primary Examiner—Matthew Smith
Assistant Examiner—Yelena Rossoshek
(74) Attorney, Agent, or Firm—Richard F. Frankeny; Winstead Sechrest & Minick P.C.; Casimer K. Salys

(57) ABSTRACT

A Schematic database defining a Schematic is checked and saved. Multiple programs affected by the Logic of the VLSI Schematic are launched along with a Checking program that extracts data related to the Logic of the VLSI Schematic design and other data that may be necessary but is not related to the Logic of the VLSI Schematic design. The Schematic design programs operate as executable program states with each program state having program data inputs and outputs and program logic inputs and outputs. Once the method is started, a designer simply corrects errors that occur and then restarts the Schematic design process. If changes in the Schematic database do not affect the Logic then Logic related programs states are stopped and programs for correcting non Logic related changes are run. Program output data may be conditional with errors or unconditional without errors depending on operational modes.

55 Claims, 4 Drawing Sheets

SCHEDULER FOR SCHEMATIC RELATED JOBS

CROSS REFERENCE TO RELATED APPLICATIONS

The present invention is related to U.S. patent application Ser. No. 09/737,340 which is hereby incorporated by reference herein.

TECHNICAL FIELD

The present invention relates in general to Very Large Scale Integration (VLSI) Schematic design program scheduling method that allows a designer to submit and execute multiple VLSI Schematic design program jobs in an automated fashion.

BACKGROUND INFORMATION

Schematic generation in VLSI design is that part of the design process where the Logic and Logic interconnections are designed to implement a particular system function. The Schematic describes the logic blocks and how their inputs and outputs are connected to make various functions and ultimately an entire VLSI chip What kind of and how many devices (e.g., transistors) are required to make a given function (e.g., AND gate) may not be important to the Logic of the function relative to the Schematic.

In this phase of the VLSI design process, noise, power, actual wiring structure, delay, and etc. are not necessarily considered. There are various details in this phase of the design that affect the Logic functionality (realizing the desired function) and there are other details (e.g., device sizes, transistor types, labels, etc.) that are important but do not affect the Logic functionality of the design. Logic functionality may be represented simply by "Logic" throughout this disclosure.

Typically there are several VLSI Schematic design programs (jobs) that are run to complete and verify a VLSI design. A designer may submit the jobs in sequence or in parallel. When the designer submits the design jobs in sequence, typically errors encountered in running the first design job (program) are corrected and that job is rerun until it is error free. Outputs from the first design job are then applied to the next applicable design job. This process is continued until the VLSI Schematic design is complete. If the jobs are run in parallel, then several design jobs are launched simultaneously. In the parallel mode, the designer may have to determine whether to abort other jobs still running when a design job fails. Aborting incomplete jobs may be appropriate when it is known the failing job also indicates probable errors in the incomplete job. In other instances, a job may fail for reasons that do not adversely affect incomplete jobs and therefore these jobs may be allowed to run until completion. Regardless, the designer would have to continually take action and may have to restart several jobs to keep the VLSI design process going until all jobs complete successfully.

It is useful to review the present VLSI design job environment. In a part of the VLSI design a Schematic, which represents a desired system Logic, is generated and verified by various Schematic design and checking programs. The following describes programs which may be used to explain embodiments of the present invention:

Gatemaker—generates models and verifications of the test view

VIM—generates circuit features, inputs/outputs, transistor models, etc.

VHDL—is a high level description language view of the design

Schematic—is the circuitry diagram

Cosmetic Error Programs—programs that keep unchanged the results of schematic based programs (the data defining the Schematic itself) while updating other descriptive data.

To describe the Schematic design process, assume that the VHDL of the Schematic macro has been completed. After the Schematic is checked and saved, the VIM of the macro is generated from data in the Schematic database. At this time, the designer may run a VHDL versus Schematic checking program. On the other hand, the Gatemaker program may also be run. Gatemaker in this example comprises two steps:

1. generate the test view (Gatemaker Model) of the Schematic.
2. Validation of models
   a) generate the test patterns and apply that to the test view to generate the response,
   b) apply the same test patterns to Schematic view to generate the response,
   c) compare those two responses to see if they are the same.

After the generation of Gatemaker Model, the VHDL versus Gatemaker Model has enough inputs to do the verification. Normally, the designer discretely and manually submits these jobs in series. Submitting the VLSI Schematic design jobs may be very sequential, step-by-step, and done manually. The whole process depends on the actions of an individual designer. The designer has to keep track of multiple jobs and know which jobs to re-submit and which jobs have valid results. This takes up valuable time the designer may use for other design tasks.

Because of this there is a need for a VLSI Schematic design job scheduler that would relieve the designer of any tasks except correcting errors and re-starting the design process wherein a design job scheduler decides which programs need to be re-run and what results may be used for executing subsequent jobs.

SUMMARY OF THE INVENTION

A Schematic is generated by creating functional Logic by interconnecting library logic blocks or interconnection library macro logic blocks until it is believed that the desired function has been implemented successfully. Within a Schematic various logic blocks may require the resizing of transistors within a logic block depending on fan out requirements, speed or other requirements. While these considerations are important they may not be pertinent to the Logic represented by the Schematic. Data defining a Schematic is generated, checked and saved as the starting database. A scheduler program launches several Schematic design programs in parallel. One of the programs is a checking program that extracts and separates data from the Schematic entry that is related to the Logic of the Schematic and data that is not related to the Logic. Since initially the data has not been changed, the checking program awaits results of the first pass of Schematic program execution. The first pass will generate a Schematic which may or may not have errors. When the Schematic data is updated the Schematic design programs are re-launched. If the changes are not related to the Logic then a previously generated result data regarding the Logic may not have to be re-run and the uncompleted "Logic related" programs may be stopped. However, if the changes are related to Logic then the programs are allowed to run to completion and the resulting errors noted and corrected by the designer. As the design process nears completion, when the changes are most likely cosmetic, then long running Logic programs are not re-run and their results remain as release data.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
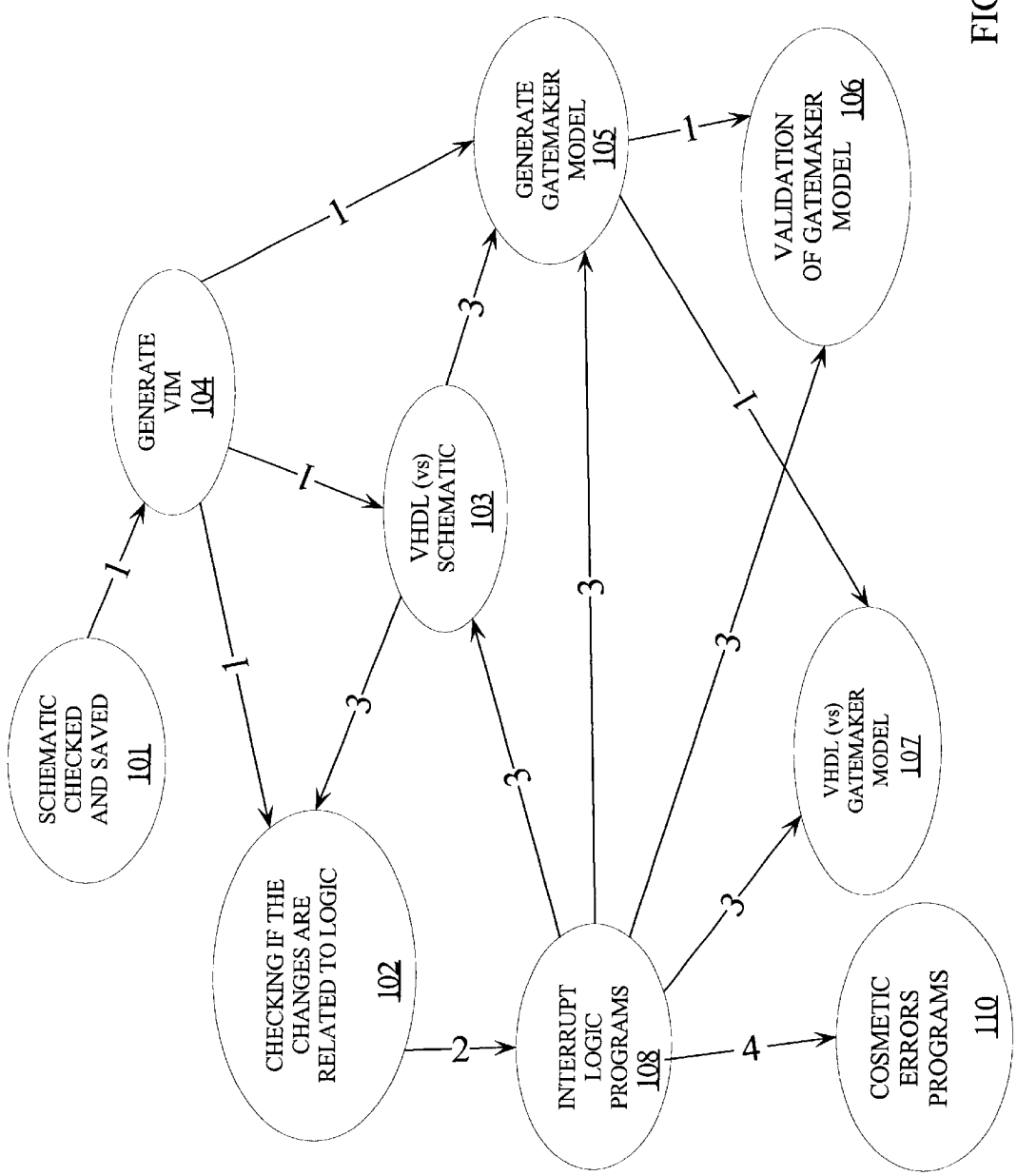
FIG. 1 is a state diagram indicating decision used in design job launch using a design job scheduler according to embodiments of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like may have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Embodiments of the present invention disclosure a method of submitting Schematic-related VLSI design jobs in "clicking one button" manner. All the jobs that are submitted on different load leveler machines are automatically being kept track of and canceled by the software program if necessary.

In embodiments of the present invention different modes are used during the VLSI Schematic design process, for example, the Audit Mode and the Non-Audit Mode. The purpose of Audit Mode is to guarantee the consistency, validity, and coherence of the database. The designer wants to make sure that the decision to "tape out" (release to manufacturing) of the Schematic is based on absolutely correct data. The design programs must all have been run without errors at the time of tape out.

One of the important criteria of microprocessor design is the computer performance index (CPI) of the design at the time of release to manufacturing. Microprocessor performance is estimated by running the microprocessor logic against the industry benchmark using the VHDL. The microprocessor logic is reflected in different views: VHDL view, Schematic view, test view, etc. If at some point in the design process all the layout design programs have run error free, then the Schematic database would have an error free tag. However, if for some reason a small change is made, then an Audit Program within the Audit Mode will detect an inconsistency between the "official" data and the changed data. This inconsistency would cause the Audit Program to assign the entire Schematic database as being in error thus rendering the entire Schematic database invalid including the CPI information.

In another example, after the design process has run, all the Schematic design programs error free the Schematic is opened in an Edit Mode. In the Audit Mode an Audit Program may determine that even a change that did not affect the Schematic (e.g., the date when programs where run and the date the Schematic was opened in the Edit mode are different) and require all the Schematic programs to be rerun.

Near the "tape out" (release to manufacturing) phase, all the runs are done in Audit Mode to check the validity of the database. At this stage, every check should have been run successfully at least once. Therefore all the inputs, correct or not correct, are already generated. However, past experience shows that all the jobs have to be rerun many times until the tape out date (ready to complete VLSI layout) due to small changes in Schematic, cell libraries or checking decks. The designer wants to have a quick turn-around time in rerunning those checks on the database. This kind of environment is suitable for the proposed method. Since all the checks are to be rerun, most of them are likely to pass.

There are other changes, which when made to the Schematic, do not affect the Logic of the VLSI function represented by the Schematic. For example, device size, transistor type (normal voltage threshold, low voltage threshold), wiring, instance name, wire label, or explanation comments on the Schematic do not change the Logic. There are cases wherein changes are "cosmetic" and the circuit build-up structure does not change. In these cases, it may be possible to determine if the logic stays the same by simply comparing the circuit topology of each cell without considering device size/type, wiring, etc. and by checking if the cell connections between cells, flat or hierarchically, remain the same. Using a program scheduler, according to embodiments of the present invention, will speed up the Audit Mode when the VLSI design is near completion since it is more likely that changes do not affect the logic of a VLSI Schematic.

Figure 4:
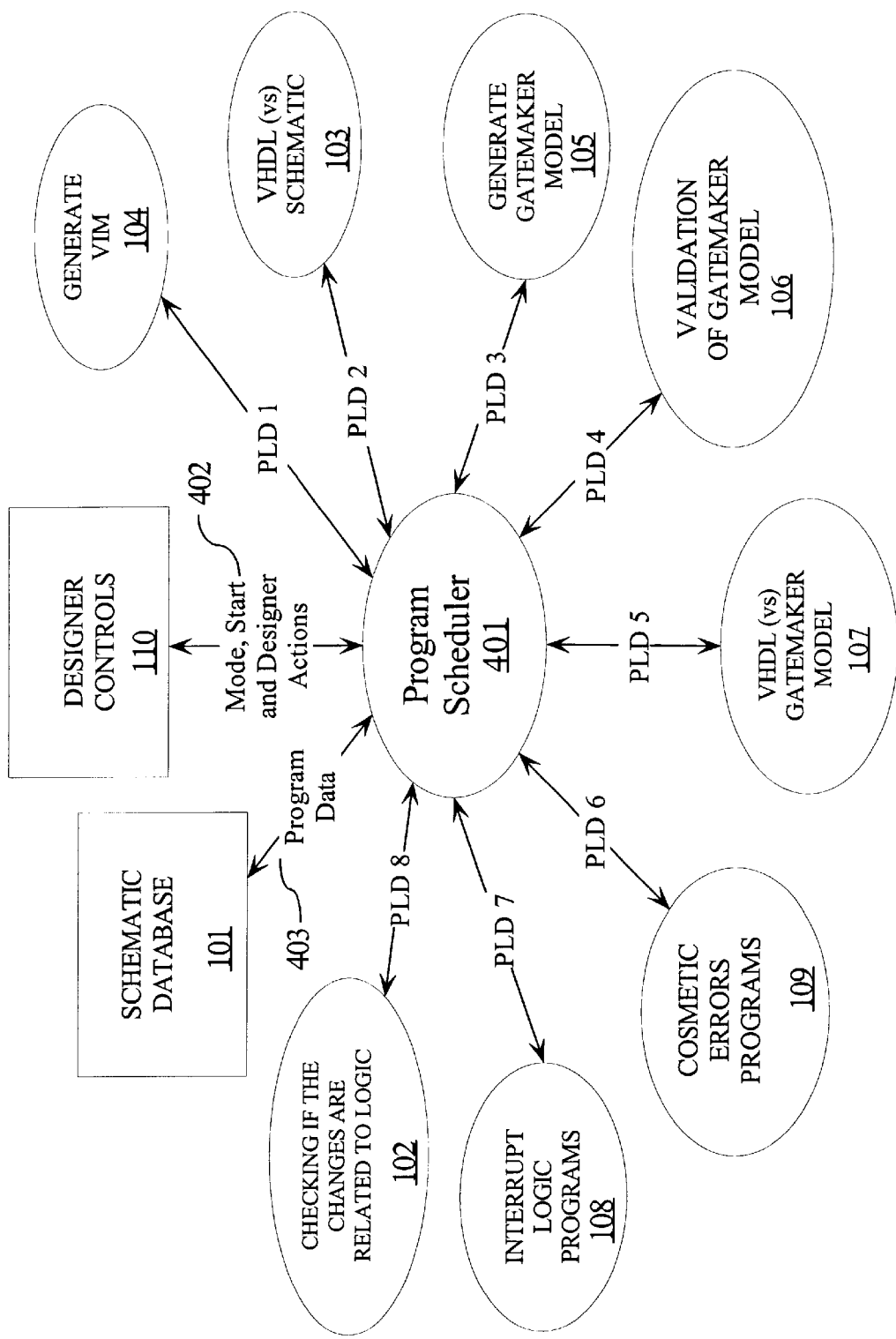
FIG. 4 is a diagram that illustrates the interconnection of program states and the program scheduler, designer controls and schematic database.

FIG. 4 illustrates how the program scheduler 401 interconnects all the program states (102 through 109), Schematic database 101 and Designer Controls 110.

Designer Controls 110 are used by a Designer to direct operation of the program scheduler 401 by passing commands and data 402 (e.g., mode control, start, Designer action data, etc.). Program data 403 for the individual program states is accessed by the programs scheduler 401 from the Schematic database 101. The Designer simply starts the Schematic design process and the program scheduler 401 schedules the programs and runs, stops and reruns the program states in response to program logic outputs and the mode controls and then tags program output data and updates the Schematic database 101.

FIG. 1 is a design program state diagram illustrating the possible paths of a Schematic design program execution during the VLSI Schematic design process according to embodiments of the present invention. Paths between various program states are illustrated in FIG. 1 by including a number in each path. The following is a legend explaining the conditions and associated numbers governing transition paths used in following embodiments of the present invention:

(1)—unconditional launch of the program state
(2)—if the source program state failed, continue incomplete running programs
(3)—if the source program state fails, signal stop incomplete running programs
(4)—launch Cosmetic error correction programs only After the Schematic is checked and saved in state 101, the Schematic view is generated by launching the program GenVim 104. When GenVim 104 completes, it launches (path 1) a Checking program 102. The Checking program 102 determines whether or not any changes to the Schematic database are related to the Logic (e.g., device size, transistor type, labels, instance names and etc.). The program GenVim 104 also launches a program VHDL versus Schematic 103 which compares the VHDL description with the Schematic and Generate Gatemaker 105 (paths 1) which generates a test view model (Gatemaker). A test view creates models used to describes what outputs are expected with input patterns to check the validity of the Logic of the Schematic.

The Checking program 102 determines if the any changes made to the Schematic cause the Logic, described by the Schematic, to remain unchanged (conserves the Logic). If the changes conserve the Logic, the Checking program 102 may stop or interrupt (paths 3) programs incomplete and still running. The Checking program 102 may stop, VHDL versus Schematic 103, Gatemaker 105, VHDL versus Schematic 107, and Validation of Gatemaker Model 106. At the same time, the Checking program may keep (determined by the scheduler program and the mode) the results (grades) of the previous run. If the results of previous run are bad (errors affected the Logic), the bad results may still be in the release area (runs completed have not run error free). If the results of previous run are good, the good results are also still in the release area. If the Checking program 102 determines that the changes does conserve the Logic, it signals (path 2) Interrupt Logic Programs 108 to stop (paths 3) Logic programs that are running. In the case that the Logic is conserved then there is no need to rerun the Logic programs. If the Checking program 102 determines that the changes are not related to the Logic (e.g. "cosmetic errors") then Cosmetic error programs (path 4) update the Schematic database data that is not related to the Logic of the Schematic.

The VHDL versus Schematic 104 verifies that the VHDL and Schematic view are equivalent. If VHDL versus Schematic 104 executes successfully, then no additional action is taken. However, if VHDL versus Schematic 104 fails (VHDL and Schematic view are not equivalent), VHDL versus Schematic signals a stop (paths 3) to Generate Gatemaker 105 and/or the Checking program 102.

When Generating Gatemaker 105 sends a signal (paths 1) it simultaneously launches Validation of Gatemaker Model 106 and VHDL versus Gatemaker Model (test view) 107. A failure of Generating Gatemaker 105 results in Validation of Gatemaker Model 106 and VHDL versus Gatemaker Model 107 not being launched. VHDL versus Gatemaker Model 107 determines if VHDL and Gatemaker Model are equivalent. The program, VHDL versus Gatemaker Model 107, is launched after Generating Gatemaker Model 105 is complete. The Designer would receive Designer action data to correct errors and update the Schematic data and restart the program scheduler. Restarting the programs scheduler 401 would repeat the Schematic design process according to embodiments of the present invention.

The run time for the sequence Schematic related design programs, according to embodiments of the present invention, may be determined. The best case run time occurs when the Checking program in 102 completes first and there are no Logic changes. A normal case may be as follows in equation form:

running time=GenVim(time)+worst case of [(VHDL versus Schematic(time) OR Generating Gatemaker Model(time)) AND (VHDL versus Gatemaker Model(time) OR Generating Gatemaker Model(time)) AND Validation of Gatemaker Model(time).]

There are effectively two branches in the diagram of FIG. 1. The branch on the left (Checking program 102 and Continue 108) is not needed in a normal manual program submission process. Its purpose is just to speed up the process of running the Schematic design programs. The result of the Checking program 102, may stop or keep the results of design programs (jobs) of the branch on the right (e.g., states 104, 105, 106, and 107). The success of Checking program 102 may keep the results (grades) of a previous run of Schematic related design jobs. The branch on the right, GenVIM 104, VHDL versus Schematic 103, Generate Gatemaker 105, VHDL versus Gatemaker Model 107, and Validate Gatemaker Model 106 comprise the checking and modeling programs that are related to the Logic and rerunning these programs may not be needed for changes not related to the Logic. Stopping Schematic design programs related to the Logic (paths 3) from Interrupt Logic Program 108 when changes are only cosmetic errors allows rerunning (path 4) only Cosmetic errors programs 110. The Cosmetic errors program 110 correct those errors which are known to not affect the Logic.

Embodiments of the present invention free the designer from keeping track of the various Schematic design jobs. If the whole process needs to be rerun due to cosmetic changes in Schematic, the designer just needs to "click one button" the expectation is that Schematic design pass will complete run error free. Embodiments of the present invention also speed up the Schematic design process because of the Checking program 102 which determines if changes made in error correction still conserve the Logic eliminating unnecessary re-runs.

Figure 2:
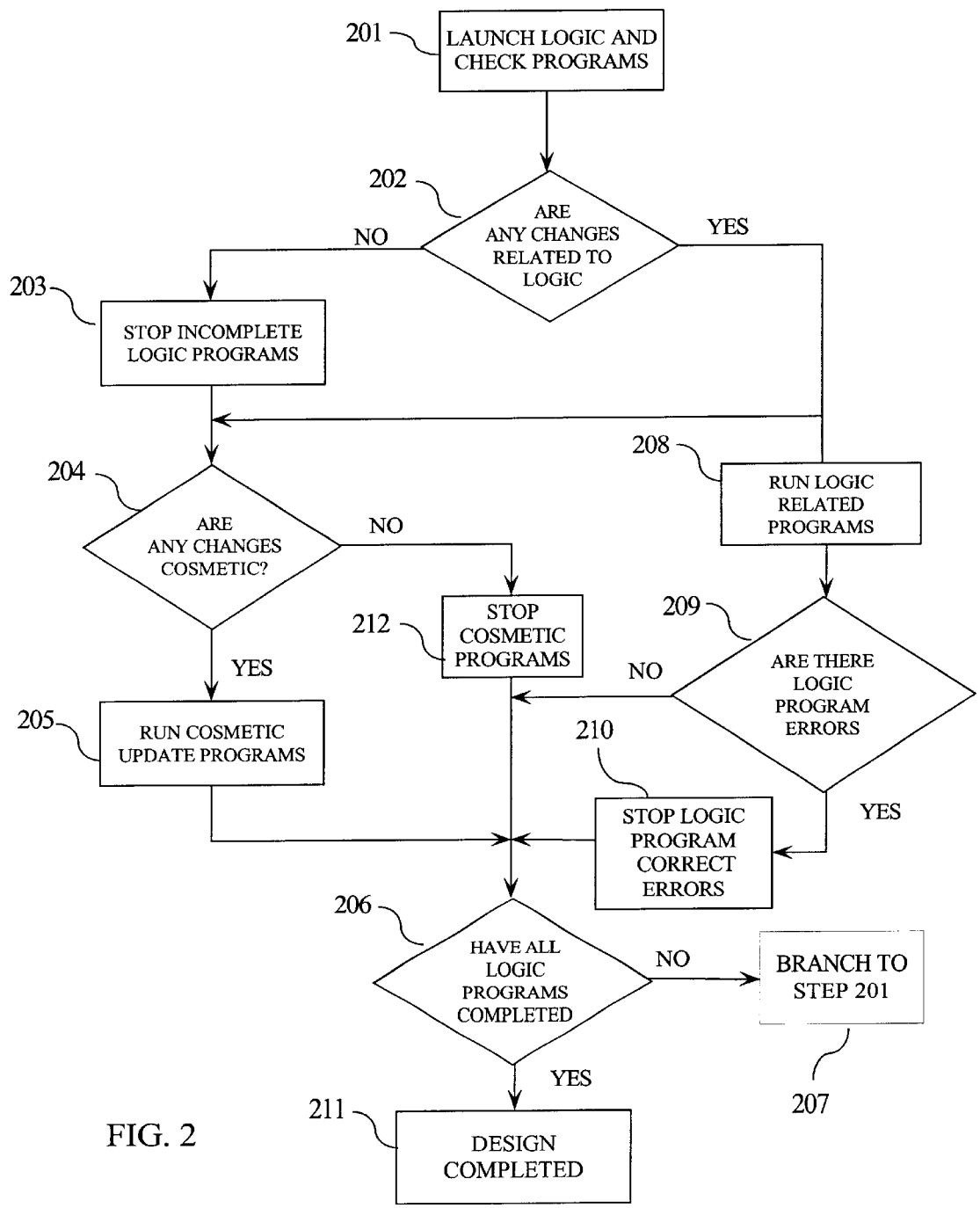
FIG. 2 is a flow diagram of steps in an embodiment of the present invention.

FIG. 2 illustrates a flow diagram of steps in embodiments of the present invention. In step 201 both the Logic related programs (e.g., Gen Vim 104, Checking 102, VHDL versus Schematic 103 and Generate Gatemaker 105) are launched simultaneously. In step 202, a test is run to determine if any changes are related to Logic. If the result of the test in step 201 is NO, then incomplete Logic programs are stopped in step 203. Since Logic programs are launched in response to outputs from other programs, multiple programs may be running at this time. A test is done in step 204 to determine if any changes to the Schematic data are "cosmetic" (do not change the Logic). If the result of the test in step 204 is NO, then any launched Cosmetic programs 110 are stopped in step 212. Then a test is done in step 206 to determine if all Logic related programs have completed successfully. If the result in step 206 is NO, then a branch to step 201 is executed in step 207. If the result in step 206 is YES, then the Schematic design is complete in 211. If the result of the test in step 204 is YES then Cosmetic data update programs are run in step 205 and then step 206 is executed as explained above. If the result of the test in step 202 is YES, the changes may contain both cosmetic and Logic changes. Therefore both steps 204 and 208 are executed. The branch to step 204 has been explained above. In step 208, Logic related programs are launched. A test is done in step 209 to determine if there are any Logic program errors. If the result of the test in step 209 is YES, then step 210 the Logic program errors are corrected and step 206 is executed as explained above. If the result of the test in step 209 is NO, then the Logic related programs have run successfully and then step 206 is executed as explained above.

Figure 3:
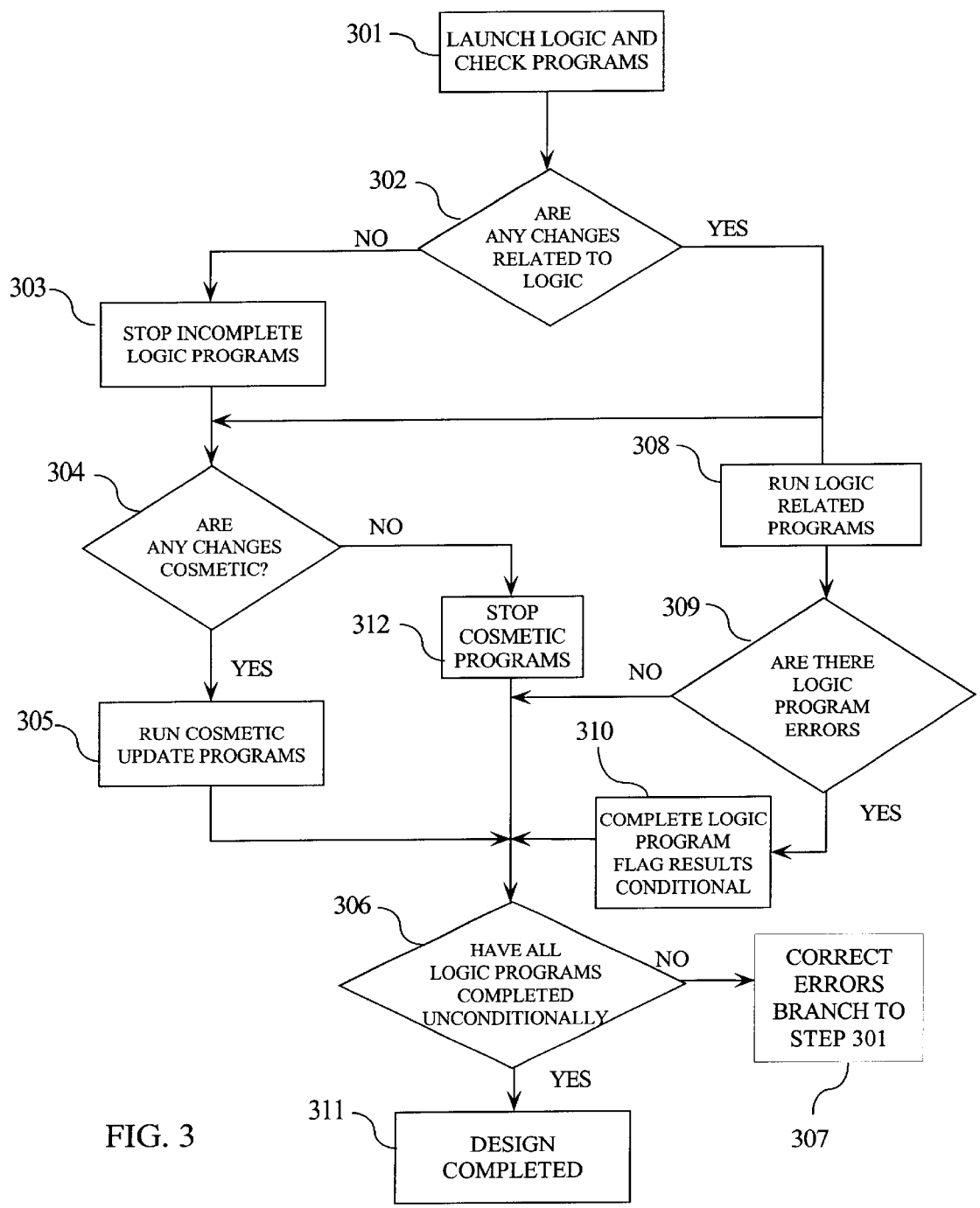
FIG. 3 is a flow diagram of execution of one of the programs in an embodiment of the present invention.

FIG. 3 is a flow diagram of another embodiment of the present invention. In step 301 both the Logic related programs (e.g., Gen Vim 104) are launched simultaneously. In step 302, a test is run to determine if any changes are related to Logic. If the result of the test in step 302 is NO, then incomplete Logic programs are stopped in step 303. Since Logic programs are launched in response to outputs from other programs, multiple programs may be running at this time. A test is done in step 304 to determine if any changes to the Schematic data are cosmetic. If the result of the test in step 304 is NO, then any launched cosmetic programs are stopped in step 312. Then a test is done in step 306 to determine if all Logic related programs have completed unconditionally. If the result in step 306 is NO, then in step 307 the errors are corrected and a branch is executed to step 301. If the result in step 306 is YES, then the Schematic design is complete in step 311. If the result of the test in step 304 is YES then Cosmetic data update programs 110 are run in step 305 and then step 306 is executed as explained above. If the result of the test in step 302 is YES, the changes may contain both cosmetic and Logic changes. Therefore both steps 304 and 308 are executed. The branch to step 304 has been explained above. In step 308, Logic related programs are launched. A test is done in step 309 to determine if there area any Logic program errors. If the result of the test in step 309 is YES, then in step 310 the Logic programs are completed and results are flagged as conditional and step 306 is executed as explained above. If the result of the test in step 309 is NO then the Logic related programs have run successfully and then step 306 is executed as explained above.

Referring to FIG 5, an example is shown of a data processing system 500 which may use embodiments of the present invention. The system has a central processing unit (CPU) 510, which is coupled to various other components by system bus 512. Read-Only Memory ("ROM") 516 is coupled to the system bus 512 and includes a basic input/output system ("BIOS") that controls certain basic functions of the data processing system 500. Random Access Memory ("RAM") 514, I/O adapter 518, and communications adapter 534 are also coupled to the system bus 512. I/O adapter 518 may be a small computer system interface ("SCSI") adapter that communicates with a disk storage device 520 and/or a tape storage device 540. A communications adapter 534 may also interconnect bus 512 with an outside network 541 enabling the data processing system 500 to communicate with other such systems. Input/Output devices are also connected to system bus 512 via user interface adapter 522 and display adapter 536. Keyboard 524, trackball 532, mouse 526, and speaker 528 are all interconnected to bus 512 via user interface adapter 522. Display 538 is connected to system bus 512 and display adapter 536. In this manner, a user is capable of inputting to the data processing system 500 through the keyboard 524, trackball 532, or mouse 526, and receiving output from the system via speaker 528, and display 538. Data processing system 500 may employ software which uses methods according to embodiments of the present invention. With—Embodiments of the present invention may use a typical data processing system having a central processing unit, which is coupled to various other components by a system bus. A read-only memory ("ROM") is coupled to the system bus and includes a basic input/output system that controls certain basic functions of the data processing system. A random access memory ("RAM"), and I/O adapter, and a communications adapter are also coupled to the system bus. The I/O adapter may be a small computer system interface adapter that communicates with a disc storage device and/or a tape storage device. A communications adapter may also interconnect the system bus with an outside network enabling the data processing system to communicate with other such systems. Input/output devices are also connected to the system bus via a user interface adapter and a display adapter. A keyboard, trackball, mouse, and speaker are all interconnected to the system bus via the user interface adapter. A display is connected to the system bus and the display adapter. In this manner, a user is capable of inputting to the data processing system through the keyboard, trackball, or mouse, and receiving output from the system via the speaker, and display. The data processing system may employ software which uses methods according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. An Integrated Circuit (IC) Schematic design method having a set of Schematic design programs and an initial Schematic database of data describing a Schematic for an IC, said IC Schematic design method comprising the steps of:

(a) organizing said set of Schematic design programs as executable programs states;

(b) coupling said executable program states with a program scheduler;

(c) executing, in parallel, selected Logic program states from said set of Schematic programs states;

(d) executing a checking program state, said checking program state operable to detennine if changes to said Schematic database data are related to a logic functionality of said IC;

(e) completing said selected Logic program states and starting additional Logic program states unless stopped by said program scheduler;

(f) determining if all program states in said set of program states have completed successfully;

(g) correcting said Schematic database data by said designer if all programs have not completed successfully; and (h) repeating said method steps from step (c–g) in response to one or more designer control inputs, wherein said designer control inputs comprise a start program scheduler, a stop program scheduler, set Audit Mode, and set Non-Audit Mode.

2. The method of claim 1, wherein each of said program states generate program output data and logic outputs.

3. The method of claim 1, wherein said executable program states are distributed in different program execution units.

4. The method of claim 1, wherein said designer control inputs comprise a start program scheduler, set execution mode, stop program scheduler, program state status and program state errors, said program scheduler then determining the starting of program states.

5. The method of claim 1, wherein conditions for successfully completing a program state execution are modified in response to said designer control inputs.

6. The method of claim 1, wherein said selected Logic program states are related to said logic functionality of said IC Schematic design.

7. The method of claim 1, wherein a checking design program generates a checking logic output indicating whether or not changes are related to a logic functionality of said IC Schematic design.

8. The method of claim 1, wherein said Schematic design is stopped if all program states have completed successfully and designer action data is sent to said designer if all program states have not completed successfully.

9. The method of claim 2, wherein said program scheduler receives said program output data and logic outputs and generates said program input data and logic inputs, said program scheduler further receiving said designer control inputs and said Schematic database data.

10. The method of claim 2 wherein said program scheduler stops said execution of said Logic program states in response to said program logic output.

11. The method of claim 2, wherein said program output data is used to verify or update said IC Schematic.

12. The method of claim 2, wherein said program logic outputs comprise program state status, said program state status comprising an execution completed with errors signal, execution completed without errors signal and an executed not completed signal.

13. The method of claim 2, wherein said program scheduler stops program state executions on a program state error, in response to a designer control, or in response to a program logic output.

14. The method of claim 2, wherein said program output data of a completed Logic program state is retained after another failed Logic program state is stopped, said retained program output data updating data in said Schematic database.

15. The method of claim 4, wherein said checking program is stopped in response to a program Logic output of a failed Logic program state.

16. The method of claim 4, wherein said execution modes comprise an Audit Mode in which all program states must complete error free.

17. The method of claim 4, wherein said execution modes comprise a Non-Audit Mode in which program states may complete conditionally and program output data is tagged as conditional with errors.

18. The method of claim 7, wherein said program scheduler stops said execution of said Logic program states in response to said checking logic output.

19. The method of claim 7, wherein said Logic program states are stopped in response to said checking logic output if said changes to said Schematic database are not Logic related.

20. The method of claim 8, wherein said designer action data comprises identification data indicating which data in said Schematic database is in error and needs correction.

21. The method of claim 9, wherein said program input data is selected from said Schematic database data.

22. The method of claim 9 wherein said executable program states and said program scheduler are coupled and communicate said program input and output data and said program logic inputs and outputs in a network.

23. The method of claim 9 wherein said program logic inputs comprise a stop program state execution signal, a start program state execution signal, and a complete program state execution and tag program output data as conditional with errors signal.

24. A computer program product for an Integrated Circuit (IC) schematic design method having a set of Schematic design programs and an initial schematic database of data describing a schematic for an IC, said computer program product embodied in a machine readable medium, including programming for a processor, said computer program comprising a program of instructions for performing the program steps of (a) organizing said set of Schematic design programs as executable programs states;

(b) coupling said executable program states with a program scheduler;

(c) executing, in parallel, selected Logic program states from said set of Schematic programs states;

(d) executing a checking program state, said checking program state operable to determine if changes to said Schematic database data are related to a logic functionality of said IC;

(e) completing said selected Logic program states and starting additional Logic program states unless stopped by said program scheduler;

(f) determining if all program states in said set of program states have completed successfully;

(g) correcting said Schematic database data by said designer if all programs have not completed successfully; and (h) repeating said method steps from step (c–g) in response to one or more designer control inputs, wherein said designer control inputs comprise a start program scheduler, a stop program scheduler, set Audit Mode, and set Non-Audit Mode.

25. The computer program product of claim 24, wherein each of said program states generate program output data and logic outputs.

26. The computer program product of claim 24, wherein said executable program states are distributed in different program execution units.

27. The computer program product of claim 24, wherein said designer control inputs comprise a start program scheduler, set execution mode, stop program scheduler, program state status and program state errors, said program scheduler then determining the starting of program states.

28. The computer program product of claim 24, wherein conditions for successfully completing a program state execution are modified in response to said designer control inputs.

29. The computer program product of claim 24, wherein said selected Logic program states are related to said logic functionality of said IC Schematic design.

30. The computer program product of claim 24, wherein a checking design program generates a checking logic output indicating whether or not changes are related to a logic functionality of said IC Schematic design.

31. The computer program product of claim 24, wherein said Schematic design is stopped if all program states have completed successfully and designer action data is sent to said designer if all program states have not completed successfully.

32. The computer program product of claim 25, wherein said program scheduler receives said program output data and logic outputs and generates said program input data and logic inputs, said program scheduler further receiving designer control inputs and said Schematic database data.

33. The computer program product of claim 25 wherein said program scheduler stops said execution of said Logic program states in response to said program logic output.

34. The computer program product of claim 25, wherein said program output data is used to verify or update said IC Schematic.

35. The computer program product of claim 25, wherein said program logic outputs comprise program state status, said program state status comprising an execution completed with errors signal, execution completed without errors signal and an executed not completed signal.

36. The computer program product of claim 25, wherein said program scheduler stops program state executions on a program state error, in response to a designer control, or in response to a program logic output.

37. The computer program product of claim 25, wherein said program output data of a completed Logic program state is retained after another failed Logic program state is stopped, said retained program output data updating data in said Schematic database.

38. The computer program product of claim 27, wherein said checking program is stopped in response to a program Logic output of a failed Logic program state.

39. The computer program product of claim 27, wherein said execution modes comprise an Audit Mode in which all program states must complete error free.

40. The computer program product of claim 27, wherein said execution modes comprise a Non-Audit Mode in which program states may complete conditionally and program output data is tagged as conditional with errors.

41. The computer program product of claim 30 wherein said program scheduler stops said execution of said Logic program states in response to said checking logic output.

42. The computer program product of claim 30 wherein said Logic program states are stopped in response to said checking logic output if said changes to said Schematic database are not Logic related.

43. The computer program product of claim 31, wherein said designer action data comprises identification data indicating which data in said Schematic database is in error and needs correction.

44. The computer program product of claim 32, wherein said program input data is selected from said Schematic database data.

45. The computer program product of claim 32 wherein said executable program states and said program scheduler are coupled and communicate said program input and output data and said program logic inputs and outputs in a network.

46. The computer program product of claim 32 wherein said program logic inputs comprise a stop program state execution signal, a start program state execution signal, and a complete program state execution and tag program output data as conditional with errors signal.

47. A data processing system, comprising:
   a central processing unit (CPU);
   shared random access memory (RAM);
   read only memory (ROM);
   an I/O adapter;
   a display adapter;
   a display; and
   a bus system coupling devices internal to said CPU, said CPU operable to execute computer program product for an Integrated Circuit Schematic design method, said IC Schematic design having a set of Schematic design programs and an initial Schematic database of data describing said IC Schematic, said computer program product embodied in a machine readable medium, including programming for a processor, said computer program comprising a program of instructions for performing the program steps of:
   (a) organizing said set of Schematic design programs as executable programs states;
   (b) coupling said executable program states with a program scheduler;
   (c) executing, in parallel, selected Logic program states from said set of Schematic programs states;
   (d) executing a checking program state, said checking program state operable to determine if changes to said Schematic database data are related to a logic functionality of said Schematic design;
   (e) completing said selected Logic program states and starting additional Logic program states unless stopped by said program scheduler;
   (f) determining if all program states in said set of program states have completed successfully;
   (g) correcting said Schematic database data by said designer if all programs have not completed successfully; and
   (h) repeating said method steps from step (c–h) in response to one or more designer control inputs, wherein said designer control inputs comprise a start program scheduler, a stop program scheduler, set Audit Mode, and set Non-Audit Mode.

48. The data processing system of claim 47, wherein each of said program states generate program output data and logic outputs.

49. The data processing system of claim 47, wherein said executable program states are distributed in different program execution units.

50. The data processing system of claim 47, wherein said designer control inputs comprise a start program scheduler, set execution mode, stop program scheduler, program state status and program state errors, said program scheduler then determining the starting of program states.

51. The data processing system of claim 47, wherein conditions for successfully completing a program state execution are modified in response to said designer control inputs.

52. The data processing system of claim 47, wherein said selected Logic program states are related to said logic functionality of said IC Schematic design.

53. The data processing system of claim 47, wherein a checking design program generates a checking logic output indicating whether or not changes are related to a logic functionality of said IC Schematic design.

54. The data processing system of claim 47, wherein said Schematic design is stopped if all program states have completed successfully and designer action data is sent to said designer if all program states have not completed successfully.

55. The data processing system of claim 48, wherein said program scheduler receives said program output data and logic outputs and generates said program input data and logic inputs, said program scheduler further receiving said designer control inputs and said Schematic database data.

* * * * *

UNITED STATES PATENT AND TRADEMARK OFFICE
CERTIFICATE OF CORRECTION

PATENT NO. : 6,609,227 B2
DATED : August 19, 2003
INVENTOR(S) : Douglas Hooker Bradley and Tai Anh Cao It is certified that error appears in the above-identified patent and that said Letters Patent is hereby corrected as shown below:

Column 9,
Line 46, please replace "7" with -- 6 --.

Column 11,
Line 25, please replace "30" with -- 29 --.

Signed and Sealed this

Sixth Day of July, 2004

JON W. DUDAS
*Acting Director of the United States Patent and Trademark Office*